United States Patent [19]

Altes

[11] Patent Number: 4,857,777

[45] Date of Patent: Aug. 15, 1989

[54] MONOLITHIC MICROWAVE PHASE SHIFTING NETWORK

[75] Inventor: Stephen K. Altes, Fayetteville, N.Y.

[73] Assignee: General Electric Company, Syracuse, N.Y.

[21] Appl. No.: 25,971

[22] Filed: Mar. 16, 1987

[51] Int. Cl.$^4$ ............................................. G01R 25/04
[52] U.S. Cl. ................................... 307/511; 307/262; 307/512; 328/55; 328/155
[58] Field of Search ................. 328/155, 55, 133, 167; 307/512, 262, 511, 513; 333/172, 138, 139

[56] References Cited

U.S. PATENT DOCUMENTS

| | | | |
|---|---|---|---|
| 2,914,673 | 11/1959 | Levin et al. | 307/262 |
| 2,984,799 | 5/1961 | Gerks | 328/155 |
| 3,621,406 | 11/1971 | Paine et al. | 307/512 |
| 3,784,934 | 1/1974 | Ohsawa | 333/138 |
| 4,123,712 | 10/1978 | Mikhael | 333/172 |
| 4,638,190 | 1/1987 | Hwang et al. | 307/512 |
| 4,647,843 | 3/1987 | Gawargy | 333/172 |

OTHER PUBLICATIONS

Wideband Phase Shift Networks—R. B. Dome/Electronics, Dec. 1946, pp. 112–115.
Properties of Some Wide-Band Phase Splitting Networks—D. G. C. Luck/Proceedings of the I.R.E., Feb. 1949, pp. 147–151.
Design of RC Wide-Band 90-Degree Phase Difference Network-D. K. Weaver, Jr. Proceedings of the I.R.E., Apr. 1954, pp. 671–676.
Normalized Design of 90° Phase-Difference Networks—S. D. Bedrosian/IRE Transactions on Circuit Theory, Jun. 1960, pp. 128–136.
Monolithic RC All-Pass Networks with Constant-Phase-Difference Outputs—Altes, Chen & Ragonese/IEEE Transactions on Electron Devices, Dec. 1986, pp. 2064–2068.
"GaAs Phase-Coherent Microwave Multiple-Signal Generation Using All-Pass Networks" Altes et al.—1986 Microwave Millimeter-Wave Monolithic Circuit Symposium—pp. 71–74.

Primary Examiner—John S. Heyman
Assistant Examiner—Timothy P. Callahan
Attorney, Agent, or Firm—Richard V. Lang; Carl W. Baker; Fred Jacob

[57] ABSTRACT

A phase shifting network with multiple outputs between which a constant phase difference is maintained over a large frequency range. The configuration consists of a four branch all pass network which in turn consists of four similar all pass networks one in each branch. An in phase and an out of phase input signal are applied to this network and four signals in phase quadrature, 0°, 90°, 180°, and 270° may be obtained from the network. The network is designed for operation at frequencies of micro and millimeter wavelengths and may be realized from resistive and capacitive elements fabricated upon a common monolithic substrate. A suitable substrate is gallium arsenide, permitting both passive and active elements to be formed and interconnected by lithographic techniques.

14 Claims, 5 Drawing Sheets

MONOLITHIC MICROWAVE PHASE SHIFTING NETWORK

BACKGROUND OF THE INVENTION

1. Field of the Invention

The invention relates to phase shifting networks with multiple outputs between which a constant phase difference (typically 90°) is maintained over a large frequency range. The invention further relates to phase shifting networks having this capability which may be used at microwave and millimeter wave frequencies and which are suited to monolithic fabrication integrating both active and passive components.

2. Prior Art

Phase shifting networks are known with multiple outputs between which a constant phase difference is maintained over a range of frequencies. A class of networks termed "all pass networks" are useful in this connection. All pass networks maintain a constant amplitude transfer characteristic over a band of frequencies. When such all pass networks are used in pairs to achieve two outputs in quadrature, the quadrature relationship may often be maintained over a substantial range of frequencies.

Paired all pass networks using resistors and capacitors as the passive elements and vacuum tubes or transistors as the active elements have been used for this purpose for some time. The principal earliest application for such networks has been in the audio spectrum for transmitter modulation. At radio frequencies, usually above 40 MHZ, 3 db couplers combined with transmission line phase shifters have been used to produce two coherent signals of substantially constant amplitude having a constant phase difference of 90° over a range of frequencies, also for use in the modulation process.

The demand for coherent quadrature phased signal sources exists at higher radio frequencies where it is desired to form or to steer beams in antenna arrays. The use is both in reception and in transmission and for both communications and ranging. In such applications, a processor, termed a "beam former", may be required to adjust the phase of a signal in the path of each element in the array. The processor in this case must provide the same phase shift to all components of a broadband signal in the associated element. Broadband signal processing over bandwidths as high as one gigahertz are of current interest. In addition, a demand exists for beam formers covering large segments of the microwave and millimeter wave spectrum.

In a computer controlled beam former, a phase splitter may represent the first component of a "vector generator" following the oscillator. The phase splitter is then followed by a multiple output phase shifter which operates upon the two outputs which are of equal amplitude but opposite phase to provide two or four outputs between which phase quadrature is maintained. The quadrature components are then coupled to a pair of digitally controlled signal scalers such as that described in U.S. Pat. No. 4,638,190. In the scaler, the two orthogonally related coherent signals are each digitally scaled in proportions designed to form a resultant vector having a desired phase angle when the scaled components are recombined. The resultant vector, formed when the scaled components are recombined, constitutes a phase shifted replica of the original input signal.

The demand for such phase shifters now exists from moderate radio frequencies to microwave and millimeter wave frequencies. At the higher frequencies a need exists for compact phase shifters in monolithic configurations in which both active and passive components may be integrated on a common high performance substrate. Since the processing of low level signals requires that the signal to noise performance must not be significantly degraded, the need has arisen for phase shifting networks that provide minimum reductions in the signal to noise ratio. Finally, increasing bandwidth requirements have created a demand that such phase shifters be capable of maintaining a constant phase difference over an extended range of frequencies.

OBJECTS OF THE INVENTION

Accordingly, it is an object of the present invention to provide an improved phase shifting network with multiple outputs between which a constant phase difference is maintained over a range of frequencies.

It is another object of the invention to provide a phase shifting network with multiple outputs between which a constant phase difference is maintained over a wide frequency spectrum.

It is still another object of the invention to provide a phase shifting network with multiple outputs between which a constant phase difference is maintained, suited for operation at microwave and millimeter wave frequencies.

It is a further object of the invention to provide a phase shifting network with multiple outputs between which a constant phase difference is maintained over a large frequency range with minimum signal attenuation.

SUMMARY OF THE INVENTION

These and other objects of the invention are achieved in a novel wideband phase shifting circuit with multiple outputs between which a constant phase difference is maintained over a large frequency range. The circuit has means for application of an input signal at reference phase and at 180° from reference phase. Output means include a first output port for derivation of a first output signal and a second output port for derivation of a second output signal having a constant phase difference, normally 90°, from the first output signal.

The phase shifting circuit further includes a four branch all pass network, each branch being an all pass network for which the amplitude response is constant with frequency and the phase response changes as a function of frequency, and from each branch of which an output terminal is available for connection to an output port.

The first and fourth branches of this phase shifting network form two mutually inverted configurations of like valued elements to effect 180° phase differences at the first and fourth output terminals, and the second and third branches form two mutually inverted like configurations of like valued elements to effect 180° differences at the second and third output terminals. The mutually inverted branches serve to equalize the amplitude and phase response relationships between all terminals over the frequency range. Finally, the element values of the first and second branches are selected to provide a phase difference of 90° at the first and second output terminals, thus providing outputs at 0°, 90°, 180°, and 270° in relation to the given output phase.

In accordance with one practical embodiment of the invention, each branch consists of a resistor connected between one input port and the output terminal and a capacitor connected between the other input port and the output terminal to form a first order all pass network. In this network, the first RC products of the first and fourth branches are equal and the RC products of the second and third branches are equal and symmetrically disposed about the design center of the desired operating frequency range.

When a wide operating spectrum is desired, a second order all pass network may be employed in each branch. Thus, each branch may consist of a first series connected resistor-capacitor combination connected between one input port and the output, a second parallel connected resistor-capacitor combination connected between the other input port and the output, and a third parallel connected resistor-capacitor combination connected between the output and ground. The RC time constants of each resistor-capacitor combination in the first and fourth branches are set equal to each other, and the RC time constants of each resistor-capacitor combination in the second and third branches are set equal to each other.

The attenuation of the foregoing second order network may be further reduced by one of two alternative circuits which may be termed a low-high or high-low pass networks. In the low-high network each branch consists of a first resistor-capacitor combination comprising a first resistor and a first capacitor joined and serially connected in the order recited between the first and second input ports, a second resistor-capacitor combination comprising a second capacitor and a second resistor joined and serially connected in the order recited between the first resistor-capacitor joint and said second input port, and a third resistor-capacitor combination comprising a third capacitor and a third resistor joined and serially connected in the order recited between the first resistor-capacitor joint and the second resistor-capacitor joint. The second resistor-capacitor joint provides the output terminal and the third resistor-capacitor joint is connected to ground to complete the network.

Optimum element values of the RC networks described above are readily computed. Optimized values fall within ranges which are readily fabricated by monolithic techniques thus providing effective vector generators at microwave and millimeter wave frequencies. A suitable substrate material for high frequency operation is gallium arsenide.

BRIEF DESCRIPTION OF THE DRAWINGS

The inventive and distinctive features of the invention are set forth in the claims of the present application. The invention itself, however, together with further objects and advantages thereof, may best be understood by reference to the following description and accompanying drawings in which:

DESCRIPTION OF THE PREFERRED EMBODIMENTS

Figure 1A:
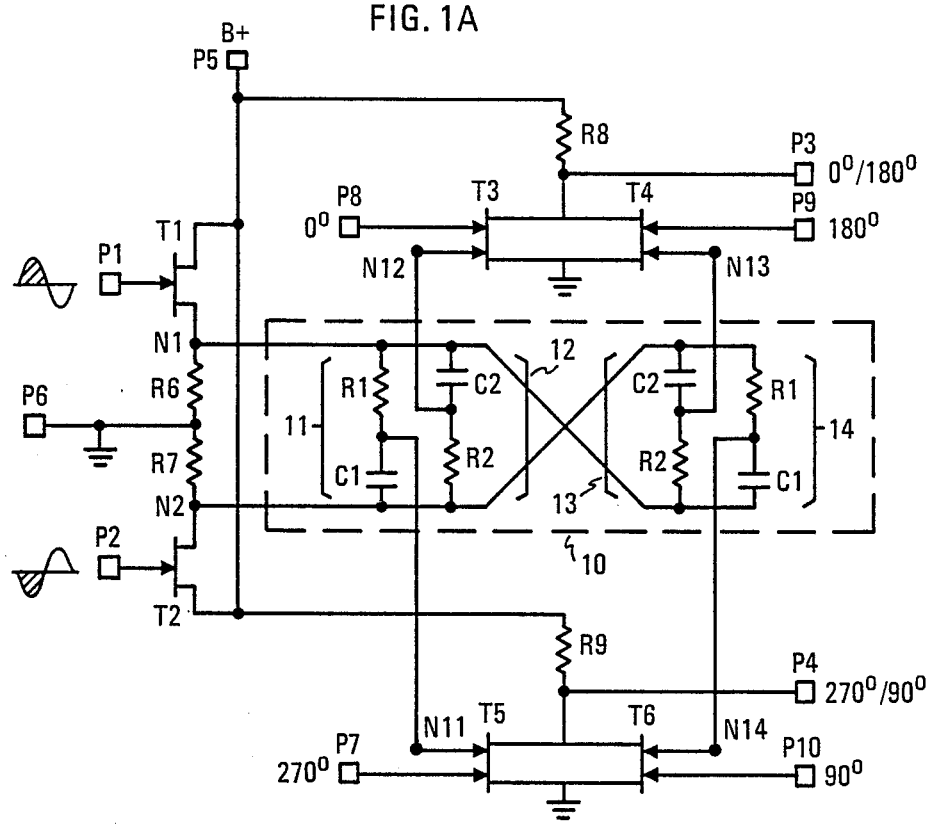
FIG. 1A is a simplified diagram of a first phase shifting circuit in accordance with the invention having multiple outputs between which a constant phase difference (typically 90° or a multiple of 90°) is maintained over a substantial frequency range, the circuit including a four branch all pass network in which each branch is a first order all pass network.

A phase shifting circuit embodying the invention is illustrated in the simplified circuit diagram of FIG. 1A. The phase shifting circuit is designed to accept, at its input ports P1 and P2, two signals which are of equal amplitude and opposite phase and to provide at its two output ports P3 and P4, two signals which are of equal amplitude and which differ in phase by 90°, and which may take one of four positions in relation to an output reference. As illustrated, the signal at output port P3 may be either at 0° or 180° in relation to the output reference and the signal output at port P4 may be at either 270° or 90° in relation to the output reference. Thus, dependent upon the selected output states, the outputs at P3 and P4 may assume four conditions; 0° at P3 and 90° at P4, 0° at P3 and 270° at P4, 180° at P3 and 90° at P4, and 180° at P3 and 270° at P4.

The phase shifting circuit, the circuit diagram of which is illustrated in FIG. 1A, is designed to be used at frequencies in the range of from 30 megahertz through 8,000 megahertz (with an open upper limit). Thus, it may be fabricated using monolithic integrated circuit techniques which are applicable to circuits operating through the microwave or millimeter wave spectrum. The FIG. 1A circuit, which may be seen to comprise active input and output transistors for impedance matching and gain as well as passive conductors, resistors and capacitors for effecting the phase shifts, is designed to be fabricated on a single monolithic semiconductor substrate. A substrate which performs this function must be suitable for the formation of localized semiconductor regions in which the active elements are formed as well as providing semi-insulating or insulating regions in which point to point conductors, resistors and capacitors may be provided without unacceptable losses.

The phase shifting circuits herein disclosed have as one important use, application to a phase shifting system for effecting digital phase control of the phase of waves supplied to or derived from an element in an antenna array. In such application, large numbers of such digital phase control combinations may be used in one equipment with each combination being subject to an individual phase adjustment. In such a combination, waves at 90° mutual phase relations, provided by the present phase shifting circuit are supplied to separate digitally controlled scalers and then recombined to form a phase shifted replica of the original signal. The vector resultant which is generated in this manner may have a number of accurately determined angular settings intermediate to each 90° quadrant.

The phase shifting circuit illustrated in FIG. 1A may be seen to comprise input means including a first input port for application of an input signal at reference phase and a second input port for application of the input signal at 180° from reference phase; an output means including a first output port for derivation of a first output signal at a predetermined phase and a second output port for derivation of a second output signal having a constant phase difference (90° or a multiple of 90°) from the first output signal. The phase shifting circuit is completed by a four branch all pass network in which each branch is in itself an all pass network and in which each branch is connected between the first and second input ports.

The input means illustrated in FIG. 1A comprises a pair of field effect transistors T1 and T2, each connected in a source follower configuration by means of which they may be driven by prior circuitry normally on the same substrate at an impedance of from one to two thousand ohms and may at the same time provide a pair of low impedance signal sources typically of 200 ohms interval impedance to the four branch all pass network. More particularly, the input means comprises a first field effect transistor T1 having its drain connected to the B+ bus leading to pad P5, and its source corresponding to node N1 is connected via load resistance R6 to the common or ground connection (pad P6). The second field effect transistor has its drain connected to the B+ bus leading to pad P5, and its source corresponding to node N2 is connected via the load resistance R7 to the pad P6. The input signal at reference phase is applied via pad P1 to the gate of transistor T1 and the input signal 180° from reference phase is applied via pad P2 to the gate of the transistor T2. Thus as noted above, the input signals applied to the gates of T1 and T2, are coupled to the input nodes N1 and N2 of the four branch all pass network 10.

The all pass network 10 is a resistor-capacitor network having four branches. The all pass network is bounded by the dashed outline bearing the reference numeral 10. Each branch of the all pass network is an all pass network in its own right, consisting of a resistor and capacitor joined and serially connected between the input nodes N1 and N2. The joint in each branch (where each resistor is connected to its associated capacitor) is connected to a corresponding output node (N11, N12, N13 or N14) for coupling via the output means to subsequent utilization apparatus.

Continuing, the first branch 11 of the all pass network 10 consists of a first resistor of value R1 and a first capacitor of value C1 joined and serially connected in the order recited between the input nodes N1 and N2. The joint is connected to the output node N11. The second branch 12 consists of a first capacitor of value C2 and a second resistor of value R2 joined and serially connected in the order recited between the input nodes N1 and N2. The joint of the second branch is connected to the output node N12. The third branch 13 consists of a first resistor of value R2 and a second capacitor of value C2 joined and serially connected in the order recited between the input nodes N1 and N2. The joint of the third branch is connected to the output node N13. The fourth branch 14 consists of a first capacitor of value C1 and a first resistor of value R1 joined and serially connected in the order recited between the input nodes N1 and N2. The joint of the fourth branch is connected to the output node N14.

The circuit properties of the network 10 may be explained by reference to the configuration and assigned circuit values. The branches 11 and 14 have identical components, a resistor and a capacitor, identical circuit values and the branches are connected in parallel with each other with the components in inverted order between the input nodes N1 and N2. This cause the phase difference between the first and fourth branches at the output nodes N11 and N14 to be 180°.

The relationship between the second and third branches is similar. The second and third branches have identical components, a capacitor and a resistor of identical circuit values, and the branches are connected in parallel with each other with the components in inverted order between the input nodes N1 and N2. This causes the phase difference between the second and third branches at output nodes N12 and N13 to be 180°.

Finally, the values (R1, C1) of the resistors and capacitors in the first and fourth branches are selected in relation to the values (R2, C2) of the resistors and capacitors of the second and third branches to produce 90° phase differences between the first and fourth branches on the one hand and the second and third branches on the other hand. Labeling the output node N12, as the port at reference phase, the phase appearing at node N14 is 90°, at output node N13 is 180°, and at output node N11 is 270°. Thus an output is available at each of the four quadrant phase positions.

Figure 1B:
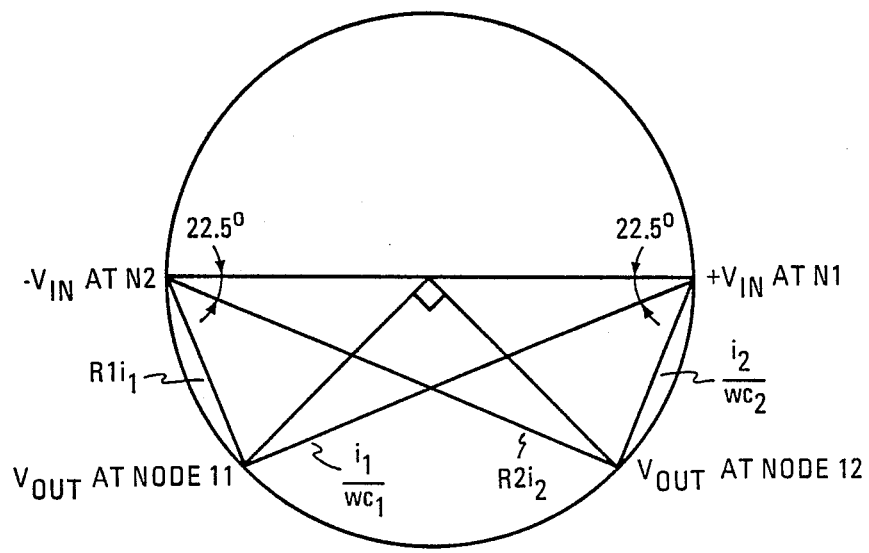
FIG. 1B is a vector diagram explanatory of the relationship between input voltages and output currents of two branches of the phase shifting circuit of FIG. 1A.

A vector diagram explanatory of the relationships between the input voltages and the output currents of the first and second branches is illustrated in FIG. 1B. The diagram contains a circle whose center corresponds to zero signal voltage or ground potential and whose radius is equal to the magnitude of the input voltages $+V_{in}$ and $-V_{in}$ measured in respect to ground at nodes N1 and N2 respectively. The input voltage at node 1 is represented by a vector drawn from the center of the circle to the right, intersecting the circle at the point N1. The input voltage at node 2 is represented by a vector drawn from the center of the circle to the left, intersecting the circle at the point N2.

The two input voltages ($+V_{in}$ and $-V_{in}$) are connected to add across each parallel branch. In the first branch, the voltage sum is applied across the serially connected resistor of value R1 and the capacitor of value C1 producing a current i1. The voltage drop caused by the signal current flowing in R1 is $R_1 i_1$; and the voltage drop caused by signal current flowing in C1 is $ji_1/\omega C_1$. The two voltage "drops" in the resistive and reactive circuit elements form voltage components orthogonal to each other and equal to the summed input voltages. The component values and the operating frequency define the relative magnitude of the resistive and reactive voltage components and thereby the phase of the output voltage at node N11. In the illustration, the selected values place the output voltage at node N11 in the third quadrant.

As an all pass network, which implies no reduction in signal amplitude as a function of signal frequency, the head of the vector representing the output voltage at node N11 will remain on the perimeter of the circle, where it is equal to $V_{in}$ absolute. The head of the vector will move, however, through the third quadrant.

The position and magnitude of the vector representing the output from branch 12 at node N12 is similarly determined. The input voltage at the branch 12 also represents the vector addition of the input voltages $+V_{in}$ and $-V_{in}$. However, in the second branch the values of the resistor R2 and the capacitor C2 have been changed from the values of R1 and C1 and their order inverted placing the vector representing the output voltage at node 12 in the second quadrant.

To achieve quadrature between the outputs at N11 and N12, the circuit values are selected to depress the vector R2i2, 22.5° below the horizontal axis and the vector i1/ωC1 22.5° below the horizontal axis at the center frequency of the desired range. When the value of R1 and C1 satisfy this angular relationship, the output voltage at node N11 referenced to ground will differ in phase by 45° from the vector representing $V_{in}$ at N2, a consequence of the geometry. Similarly the output voltage at node N12 referenced to ground will differ in phase by 45° from the vector representing $V_{in}$ at N1. This places the two outputs at N11 and N12 in quadrature.

The quadrature relation between these two outputs may be made exact at one center frequency. As the frequency increases, the capacitive reactance falls in relation to the resistances and since the elements in the branches are inverted, the outputs N11 and N12 both rotate counter-clockwise together. As the frequency depicted, the 90° relationship will be maintained to within 4° over a frequency range of 2.1 to 1 assuming a suitably low input impedance, and a suitably high output impedance.

As an alternative to the adjustment described in the previous paragraph, the phase relationship of the two outputs N11 and N12 is given a deliberate error at the center frequency. The phase will be exactly 90 at two frequencies, one higher and one lower than this center frequency. At two frequencies one still higher and the other one still lower than the previous two frequencies, the phase error will equal the one, which was deliberately introduced at the center frequency. This error having the opposite polarity from the one at the center frequency. For a maximum deviation from the exact 90° relationship of 4° the bandwidth is increased to 3 to 1. As a further alternative in which a one degree error is tolerated, assuming a one degree error at the center frequency, the error goes through zero and becomes one degree again at frequencies corresponding to a bandwidth ratio of 1.7 to 1.

Branches 13 and 14 are designed with the same considerations as branches 11 and 12.

Their presence has a double advantage. It permits access to phase relationships at each of the four quadrant positions. In addition, branch 11 is now paralleled by branch 14, which is the inversion of branch 11, and branch 14 is now paralleled by branch 13 which is the inversion of branch 12. These paralleled branches tend to compensate for the fact that a finite and non-zero input impedance must be used, and thus extend the range over which an accurate quadrature phase relationship is maintained. The four output nodes N11, N12, N13, and N14 this supply signals at 0°, 90°, 180°, and 270° to the output means for eventual utilization.

The four branch network 10 places equal load impedances on the two source followers T1 and T2 by virtue of the symmetry of this four branch network. The and N2 will maintain the same degree of accuracy that they displayed at the input points P1 and P2 without the source followers T1 and T2, which would occur if the network had only two dissimilar branches.

As illustrated in FIG. 1A, the output means comprises four dual gate MESFETs (T3, T4, T5, and T6) connected to couple one signal at 0° or 180° to the output pad P3 and one signal at 270° or 90° to the output pad P4.

The dual gate MESFETs are designed to act as switches with a second gate providing the switching function. The first dual gate MESFET T3 has its source connected to ground, its signal gate connected to the node N12 on branch 12, its switching gate to pad P7 for application of a digital signal when a zero phase output is desired. The drain of transistor T3 is coupled through a load resistance R8 to the B+ pad P5. The dual gate MESFET T4 is similarly connected, having its signal gate coupled to the node N13 on branch 13, the switching gate to the pad P9, to which signals corresponding to a 180° phase shift occurs and the drain is connected to the node at the output pad P3 common to the drain of the transistor T3. The third and fourth dual gate MESFETs T5 and T6 are similarly connected with the signal gate of MESFET T5 connected to the node N11 on branch 11 and the signal gate of MESFET transistor T6 connected to the node N14 on branch 14.

A monolithic configuration of the circuit of FIG. 1A has a high and wide operating frequency range. In the disclosed monolithic configuration, in which a gallium arsenide substrate is used, the circuit of FIG. 1A is capable of operation with current technology over a range of frequencies of from 30 MHZ to 8 GHZ. Performance has been demonstrated for the specific embodiment similar to that illustrated in FIG. 1A except for the output switches over a frequency range of from 250 MHZ to 6 GHZ.

The monolithic construction of the FIG. 1B circuit on gallium arsenide permits operation at microwave frequencies due in part to the small parasitic capacitances between the circuit elements and ground and between the various circuit elements and due in part to which supports the various circuit elements. The small parasitic capacitances are the result of the small physical dimensions of a circuit constructed in monolithic fashion, since parasitic capacitances scale in proportion to the linear dimensions of the circuit. The freedom from loss is attributable to the very high bulk resisitivity of gallium arsenide that may be realized in those portions of the substrate not within the active semiconductor regions.

Performance over these ranges of frequencies is due to the fact that the capacitances, resistances, and conductances essential to the formation of the all pass networks can be realized at the desired design values, free of undesired parasitics. The values of the capacitances created on the monolithic chip as metal-insulator-metal capacitors exceed the parasitic capacitances to ground by virtue of the fact that the thickness of the insulator is very small in comparison to the thickness of the gallium arsenide substrate. The dielectric thickness of the capacitors is typically 0.14 to 0.22 microns while the thickness of the substrate is typically 400 microns. This thickness relationship also reduces the capacitance to ground for printed resistances and conductor runs.

The all pass network illustrated in FIG. 1A has zero nominal voltage attenuation although there is power dissipation of the signal. Any power loss, which does occur, may be made up by the power gain of the FET output switches (T3–T6 in FIG. 1A).

The all pass network of the FIG. 1A circuit may be used in either the reception of low noise signals after preliminary amplification to a suitable level to avoid significant worsening of the signal to noise ratio or in the transmission path while the signal is still at a low power level. The FIG. 1A arrangement, accordingly, is simple, of low loss, and suitable for operation at low signal levels where a relative bandwidth of 1.7 with an angular accuracy of 1° in the quadrature phase shift or a relative bandwidth of 3 with an angular accuracy of 4° in quadrature phase shift is acceptable.

The principal component values for the FIG. 1A arrangement are as follows. The FET source follower transistors T1 and T2 are 120 micron gate width devices, a value which is "large" and the source load resistors R6 and R7 have values of 187.5 ohms which is "low" to achieve a suitably low driving impedance into the all pass network for optimal accuracy in the phase response. The FET source follower output transistors should be high impedance devices. In a practical realization not pictured, where cascaded single gate devices are employed instead of the dual gate devices pictured, the source follower output stages use 30 micron gate width devices, a value which is "small", having source loads of 1500 ohms. The source followers are then cascaded with output stages of similar sized devices before connection to the output pad P3. In the all pass network per se, the design value of resistance R1 is 777 ohms, of capacitance C1 is 1.95 picofarads, of resistance R2 is 388.4 ohms and of capacitance C5 is 0.668 picofarads.

The selection of values for the FIG. 1A circuit are determined by well known relationships. The geometric mean of R1C1 and R2C2 establish $1/\omega_o$, the geometric center of the frequency range over which a constant phase shift is sought. Then at that center frequency ($\omega_o$), the values of the RC products of the individual RC pairs are set to create the angular relationships of FIG. 1B, in which:

$$R1\omega_o C1 = \tan 22.5°;$$

$$R2\omega_o C2 = \cotan 22.5°. \quad (1)$$

Since only the RC products are established by these relationships, one has design freedom to elect larger or smaller values for the resistances in relation to the associated capacitive reactances.

Figure 2:
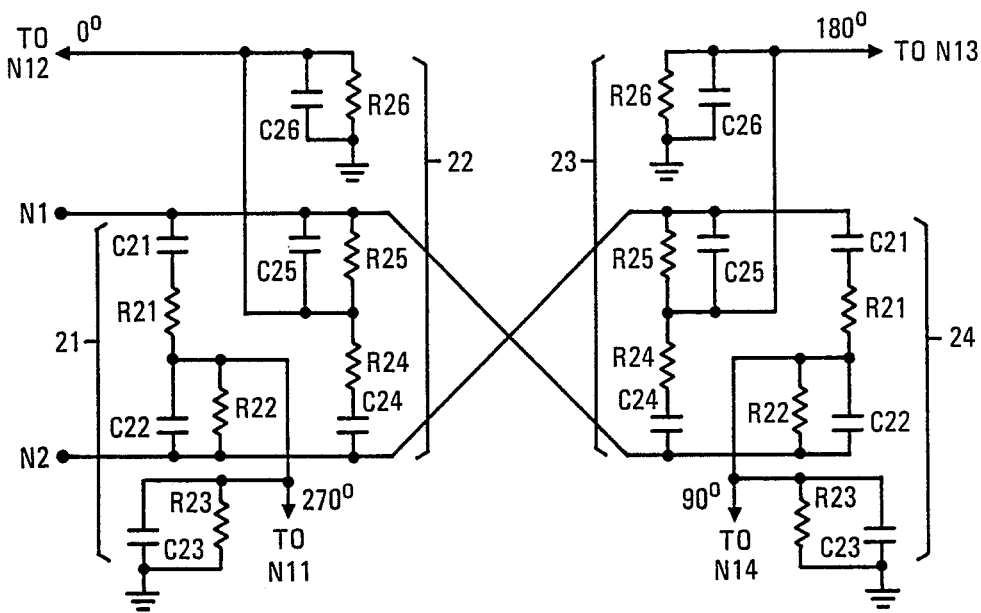
FIG. 2 is a circuit diagram of a second four branch all pass network in which each branch is a second order all pass network which provides an extended frequency range over which a constant phase difference is maintained, with substantial attenuation.

FIG. 2 illustrates an all pass network in which a quadrature phase relationship is maintained over a larger range of frequencies and/or with a greater angular accuracy than in the first order network of FIG. 1A. The all pass network of FIG. 2 may be termed a "second order" network in that the angular excursions of the vectors as the frequency varies are not limited to the 180° range of the first order network but rather to 360°. In addition, by suitable proportioning, a double humped phase shift may be achieved. The greater bandwidth in the FIG. 2 arrangement is achieved at the cost of an increase in the number of resistive and capacitive circuit elements and at a typical signal loss of 12 db. The consequences of the increase in circuit elements is trivial, while the signal loss requires compensation. The range of frequencies over which an accurate phase response may be maintained is approximately 6 to 1 with an angular accuracy of one quarter of a degree and over a range of 9 to 1 with an angular accuracy of two degrees.

The second order network consists of four parallel branches 21, 22, 23 and 24, which collectively may be substituted for the four parallel branches 11, 12, 13 and 14 of the FIG. 1A arrangement. As in the first embodiment, each of the four branches of the FIG. 2 arrangement has the same resistor-capacitor configuration, the resistors and capacitors of the second branch having values which differ from those of the first branch. Consistently the resistors and capacitors of the fourth branch have the same values as those in the first branch and the resistors and capacitors of the third branch have the same values as those in the second branch. In addition, the fourth branch is inverted in respect to the first branch in its connection between the input nodes N1 and N2 and the third branch is inverted in respect to the second branch in its connection between the input nodes N1 and N2. As in the first embodiment, each branch is an all pass network in its own right, and is connected in parallel with an inversion. In addition, the values of one pair of branches of like component values are adjusted in relation to the values of the other pair of branches to provide the necessary quadrature phase relationships. The first branch 21 in the FIG. 2 arrangement consists of three resistor-capacitor pairs R21, C21; R22, C22; R23, C23. The first branch is connected between the nodes N1 and N2 and the output derived from the branch is connected to the node N11, in the manner shown in FIG. 1A. The first resistor-capacitor pair consisting of the capacitor 21 and resistor 21 is connected in series in the order recited between the input node N1 and the output node N11. The members of the second resistor-capacitor pair R22, C22 are connected in shunt between the output node N11 and the input node N2. The members of the third resistorcapacitor pair are connected in shunt between the output node N11 and signal ground.

The second branch 22 has the same configuration as the first branch 21 but is connected in inverse order between the input nodes N1 and N2, and the output is coupled to output node N12. In addition, each component value of the second branch differs from that of the first branch so as to achieve the necessary quadrature relationship. The third branch 23 is connected to output node N13 and the fourth branch 24 is connected to output node N14.

The FIG. 2 network so formed by the four branches 21, 22, 23 and 24 may be optimized for several modes of "flatness" in the phase response with frequency. The optimization may be set to never exceed 90°, or to never exceed a selected departure above or below 90°. The allowable departure may be set at a large value of 4° or a much smaller value 0.2° for example. In one specific selection of circuit values for the FIG. 2 network, the phase response from 1900 MHZ to 8100 MHZ varied from a low of 89.8° to a high of 90.22°, achieving a maximum tolerance of ±0.2 of a degree in angular accuracy. Assuming a tolerance of ±2°, and comparable component values, the useful frequency range is approximately from 1300 MHZ to 11,700 MHZ, which is a range of approximately 9 to 1.

The design values of the circuit elements in the FIG. 2 arrangement for the first optimization are as follows:

| | | |
|---|---|---|
| R21 = 130.75 | R22 = 695.19 | R23 = 228.9 |
| C21 = 0.5922 pF | C22 = 0.1114 pF | C23 = 0.3383 pF |
| R24 = 130.75 | R25 = 695.19 | R26 = 228.9 |
| C24 = 0.1645 pF | C25 = 0.003094 pF | C26 = 0.09396 pF |

The six RC combinations in the first and fourth branches have the same time constant, and the six RC combinations in the second and third branches have the same time constant. The geometric mean of the two center frequencies established by these time constants is 2035.48. The calculated Q was 0.3015, where Q is the ratio of capacitive reactance to resistance in the LC prototype network.

A maximally flat response can be demonstrated to occur when $\omega_2/\omega_1 = 3.359$ $$Q = \frac{1}{2\sqrt{\sqrt{2}+1}} = 0.3218$$

In the computation, the time constants of the six RC combinations in the first and fourth branches are set equal to a first quantity $1/\omega_1$, and the time constants of the six RC combinations in the second and third branches are set equal to a second quantity $1/\omega_2$.

$$1/\omega_1 = R21C21 = R22C22 = R23C33 \quad (2)$$

$$1/\omega_2 = R24C24 = R25C25 = R26C26$$

The first ($1/\omega_1$) and second ($1/\omega_2$) quantities are selected for symmetry in relation to the center of the desired operating frequency range. At this point, the difference in the time constants, which affects circuit Q and the flatness of the response, is determined. Given a value for Q, e.g. 0.3, one may calculate the values of the individual electrical circuit elements.

$$R23 = R21 \frac{1 - 4Q^2}{4Q^2} \quad (3)$$

$$R22 = R21 \frac{1 + 2Q}{Q} \quad (4)$$

$$C23 = C21 \frac{4Q^2}{1 - 4Q^2} \quad (5)$$

$$C22 = C21 \frac{Q}{1 + 2Q} \quad (6)$$

$$\frac{V_{out}}{V_{in}} = \frac{1 - 2Q}{1 + 2Q} \quad (7)$$

Assuming a circuit Q of 0.3, the ratio of the output voltage to the input voltage is 0.21 corresponding to a voltage attenuation of approximately 12 db.

The all pass network, the equations for which have been provided above, can be derived from a band pass network, which consists of a series branch resistor-capacitor pair R1C1 and a shunt branch resistor-capacitor pair R2C2. The series pair R1C1 is connected between an ungrounded input terminal and an ungrounded output terminal of an assumed three terminal network. The shunt resistor-capacitor pair are connected between the ungrounded output terminal and the network common terminal. This configuration has a band pass response. Its response is like a tuned circuit with a Q of less than one-half. On a vector diagram the response of this network describes a full circle starting at a zero amplitude at zero frequency and ending at zero amplitude at infinity. At the center frequency the response peaks. The band pass response is converted to an all pass response by shifting the zero point of this vector diagram to the center of the circle. This is accomplished by the voltage divider action of the network R2C2 and R3C3 in the all pass configuration.

Figure 3:
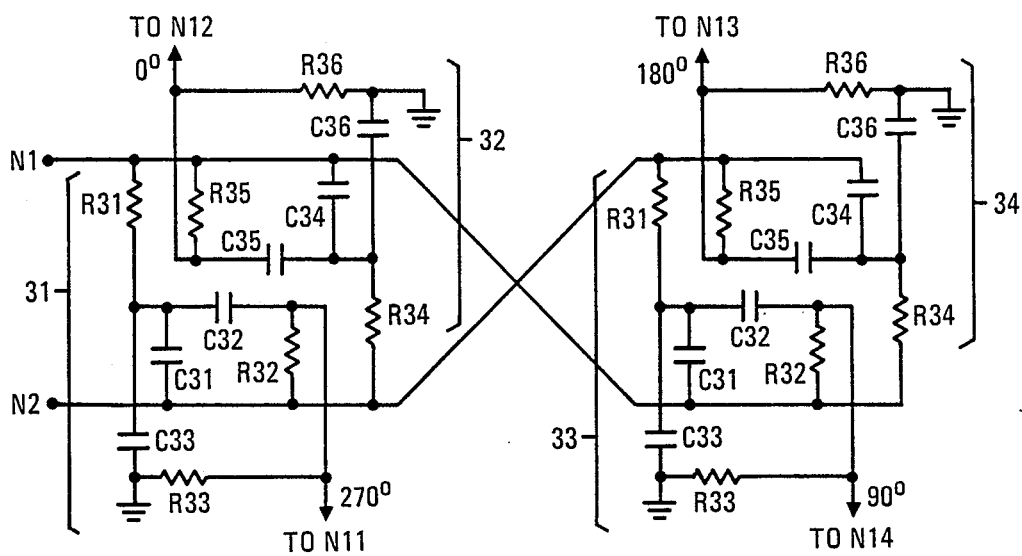
FIG. 3 is a circuit diagram of a third four branch all pass network in which each branch is a second order all pass network which provides an extended frequency range over which a constant phase difference is maintained, the network being further modified to reduce attenuation.

The four branch all pass network of FIG. 3 is a second order network representing a modification of the all pass network illustrated in FIG. 2, the modification having the effect of reducing the typical signal loss of about 12 db for the FIG. 2 network to 5 db for the FIG. 3 network. As in the prior embodiments, each branch is an all pass network in its own right and each branch is connected in parallel with an inversion. In addition, the values of one pair of branches of like component values are adjusted in relation to the values of the other pair of branches to provide the necessary quadrature phase relationships.

The first branch 31 of the FIG. 3 network consists of three resistors R31, R32 and R33 and three capacitors C31, C32 and C33. (The resistors and capacitors of the FIG. 3 network are not paired in the manner of the FIG. 2 arrangement). The resistor R31 is joined with the capacitor C32 and the two are serially connected in the order recited between the input node N1 and the output node N11. The capacitor C31 is connected between the second input node N2 and the joint between R31 and C32. The resistance R32 is connected between the input node N2 and the output node N11. The capacitor C33 is connected between the joint between R31 and C32 and ground and the resistor R33 is connected between the output node N11 and ground.

The other branches 32, 33 and 34 of the FIG. 3 configuration are similarly configured with the third branch 33 being identical to the first branch 31 including equal component values, except for being connected in inverse order between the input nodes N1 and N2 and having its output coupled to the output node N14. The second branch 32 is similar to the first branch in configuration, having a second set of component values, and being connected in inverse order between the input nodes N1 and N2 and having its output coupled to the output node N12.

The fourth branch 34 is identical to the second branch 31 including equal component values, except for being connected in inverse order between the input nodes N1 and N2 and having its output coupled to the output node N14.

The FIG. 3 arrangement may be described as a low pass/high pass network (low/high) in which the first section is a low pass section made of a resistor R31 and a capacitor C31 and a high pass section made up of the capacitor C32 and the resistor R32. The third section comprising resistor R33 and capacitor C33, also provides load compensation and does not enter into the naming of the network.

In the low/high configuration of FIG. 3, there is a virtual R1 Cv time constant, set equal to the center frequency of the range ($\omega_o$), where R1 is the value of a virtual resistor R1, and Cv is the value of a virtual capacitor, the pair being equivalent to the first RC pairs in the FIG. 2 embodiment, but tuned to the center frequency $\omega_o$.

In the FIG. 3 arrangement the design values are as follows:

$$Cv = C1 \quad (8)$$

$$C31 = Cv \frac{Q}{1+Q} \quad (9)$$

$$C32 = Cv \frac{1-2Q}{1-Q} \quad (10)$$

$$C33 = Cv \frac{2Q^2}{1-Q^2} \quad (11)$$

$$R31 = R1 \quad (12)$$

$$R32 = R31 \frac{1-Q^2}{Q(1-2Q)} \quad (13)$$

$$R33 = R31 \frac{(1+Q)(1-Q)^2}{2Q^2(1-2Q)} \quad (14)$$

$$\frac{V_{out}}{V_{in}} = \frac{1-Q}{1+Q} \quad (15)$$

The equivalent circuit values for all three RC pairs equivalent to the first, second and third RC pairs of FIG. 2 for a center frequency $\omega_0 = 3900$ MHZ.

| R21, R24 = 161.9 | R22, R25 = 826.7 | R23, 26 = 228.9 |
|---|---|---|
| C21 = 0.4621 pF | C22 = 0.09047 pF | C23 = 0.3268 pF |
| C24 = 0.1376 pF | C25 = 0.02693 pF | C26 = 0.09727 pF |

For a maximally flat response $\omega_2/\omega_1 = 3.359$ $$Q = \frac{1}{2\sqrt{\sqrt{2}+1}} = 0.3218$$

The actual circuit values for the FIG. 3 low/high configuration for a center frequency of 3900 MHZ, a maximally flat response, and two virtual capacitors of values $Cv_1 = 0.46210$ pF and $Cv_2 = 0.1376$ pF, are as follows:

| R31, R34 = 161.85 | R32, R35 = 1265.1 | R33, R36 = 1333.1 |
|---|---|---|
| C31 = 0.1125 pF | C32 = 0.2428 pF | C33 = 0.10676 pF |
| C34 = 0.03349 pF | C35 = 0.07229 pF | C36 = 0.03178 pF |

For the FIG. 3 arrangement, the ratio of the output voltage to the input voltage is 0.54 corresponding to a voltage attenuation of approximately 5 db.

Figure 4:
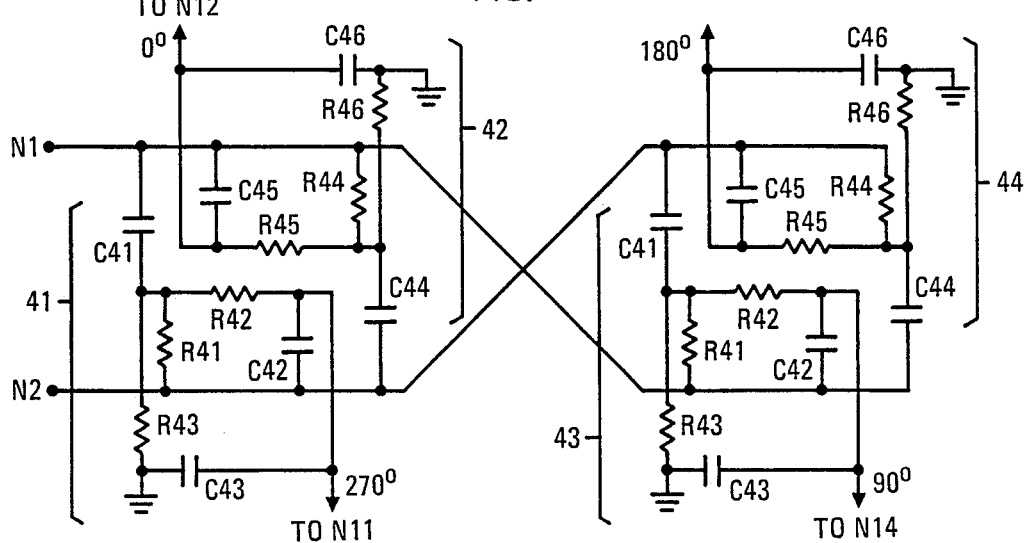
FIG. 4 is a circuit diagram of a fourth four branch all pass network in which each branch is a second order all pass network which provides an extended frequency range over which a constant phase difference is maintained, the network being further modified to reduce attenuation and representing an alternative to the third network in which resistors are substituted for capacitors, and capacitors for resistors in an otherwise like circuit configuration.

The fourth variation of the four branch all pass network is illustrated in FIG. 4. It uses the concepts of the FIG. 3 embodiment, modified in that each branch in the FIG. 4 arrangement consists of an initial high pass filter section (C41R41) followed by a low pass filter section (R42C42) to which a compensating section (R43C43) has been added. The FIG. 4 arrangement is of a similar design to the FIG. 3 arrangement and differs in that the resistors of FIG. 4 have been substituted for the capacitors of FIG. 3; and the capacitors of FIG. 4 have been substituted for the resistors of FIG. 3.

In other words, the configurations of the first and fourth branches of the FIG. 4 embodiment are alike and have like valued configurations, but are mutually inverted between the input ports. The configurations of the second and third branches of the FIG. 4 embodiments are alike and have like valued components but are mutually inverted between input ports. (This is also true of the FIG. 3 embodiment.)

In the design process of FIG. 4, there is a virtual RvC1 time constant, set equal to the center frequency of the range ($\omega_o$), where C1 is the value of a virtual capacitor C1, and Rv is the value of a virtual resistor, the pair being equivalent to the first RC pairs in the FIG. 2 embodiment, but tuned to the center frequency $\omega_o$.

The corresponding components of the first and second branches are scaled by a common factor (k)

$$R31C31 = k\, R34C34$$

$$R32C32 = k\, R35C35$$

$$R33C33 = k\, R36C36$$

where k is equal to the ratio of the respective radial frequencies of the first and second branches, the respective radial frequencies and the circuit Q being selected to achieve an optimum response.

In the FIG. 4 arrangement, the design values are as follows:

$$Rv = R1 \quad (16)$$

$$R42 = Rv \frac{1-Q}{1-2Q} \quad (17)$$

$$R41 = Rv \frac{1+Q}{Q} \quad (18)$$

$$R43 = Rv \frac{1-Q^2}{2Q^2} \quad (19)$$

$$C42 = C41 \frac{Q(1-2Q)}{1-Q^2} \quad (20)$$

$$C43 = C41 \frac{2Q^2(1-2Q)}{(1+Q)(1-Q)^2} \quad (21)$$

$$\frac{V_{out}}{V_{in}} = \frac{1-Q}{1+Q} \quad (22)$$

The equivalent circuit values for all three RC pairs, equivalent to the first, second and third RC pairs of FIG. 2, for a center frequency $\omega_o = 3900$ MHZ are as noted earlier for the FIG. 3 arrangement.

Assuming a circuit Q of 0.3218 for a maximally flat response centered on 3900 MHZ, the circuit values are:

| (Rv = 161.86) | | |
|---|---|---|
| R41, R44 = 664.83 | R42, R45 = 308.0 | R43, R46 = 700.6 |
| C41 = 0.4621 pF | C42 = 0.05912 pF | C43 = 0.05610 pF |
| C44 = 0.1376 pF | C45 = 0.0176 pF | C46 = 0.0167 pF |

For the FIG. 4 configuration, the ratio of the output voltage to the input voltage is 0.54 corresponding to a voltage attenuation of approximately 5 db.

The principal advantage of the configurations referred to as "high/low" and "low/high" over the configuration referred to as "series-shunt" is the reduction in the insertion loss. This loss takes the form of a reduced output to input voltage ratio. For the series shunt configuration this voltage ratio is equal to $$\frac{V2}{V1} = \frac{1-2Q}{1+2Q} \quad (7)$$

for the other configurations it is $$\frac{V2}{V1} = \frac{1-Q}{1+Q} \qquad (15)(22)$$

When Q is in the vicinity of 0.3 this makes the significant difference noted earlier.

Figure 5:
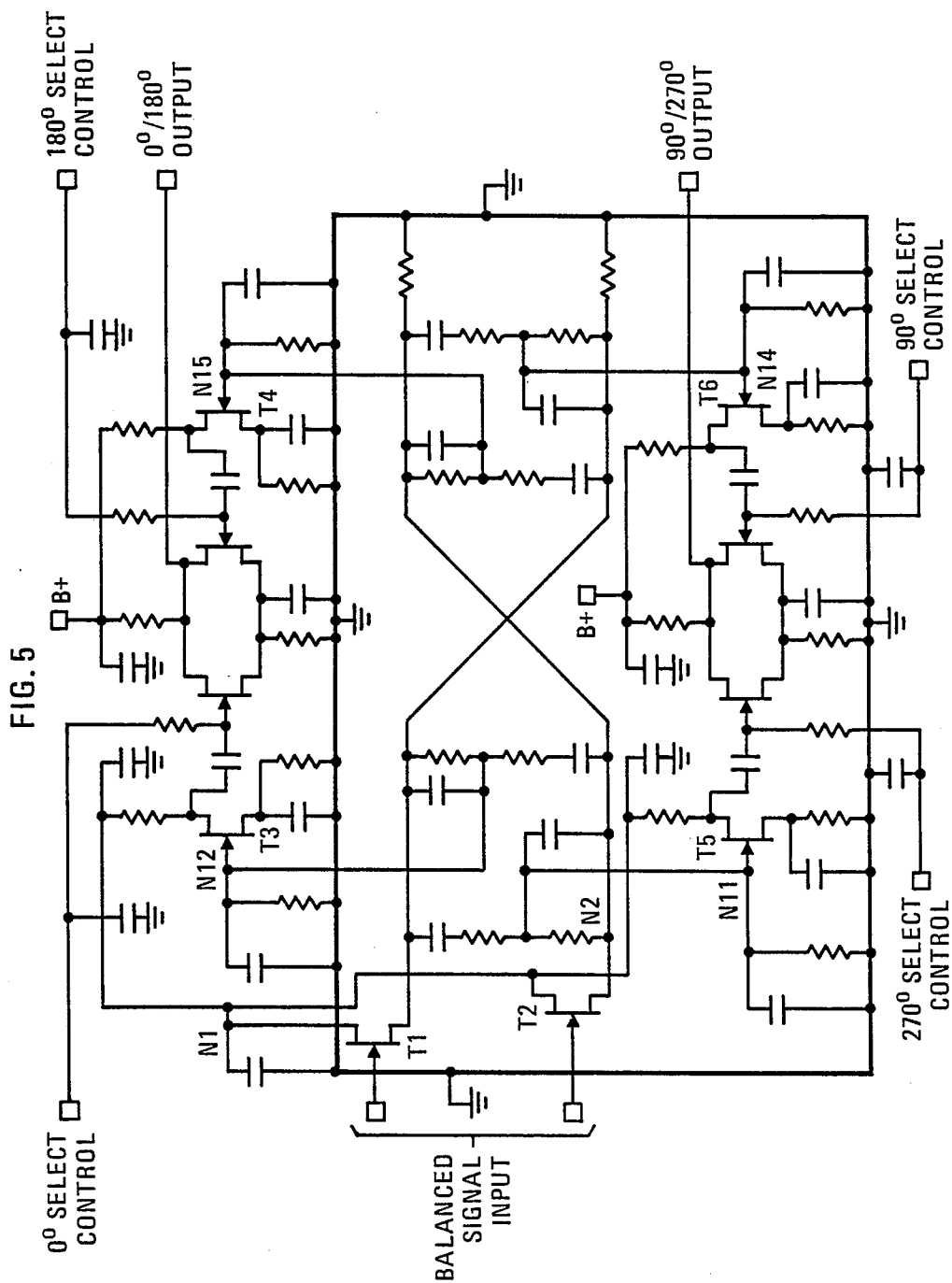
FIG. 5 is a more complete electrical circuit diagram of an embodiment of the invention operating at 4 gigahertz and employing a second order all pass network of the type illustrated in FIG. 2.

A complete circuit diagram of a phase shifting circuit employing the FIG. 2 all pass networks is illustrated in FIG. 5. The FIG. 5 arrangement incorporates the cascaded output stages noted earlier.

Figure 6:
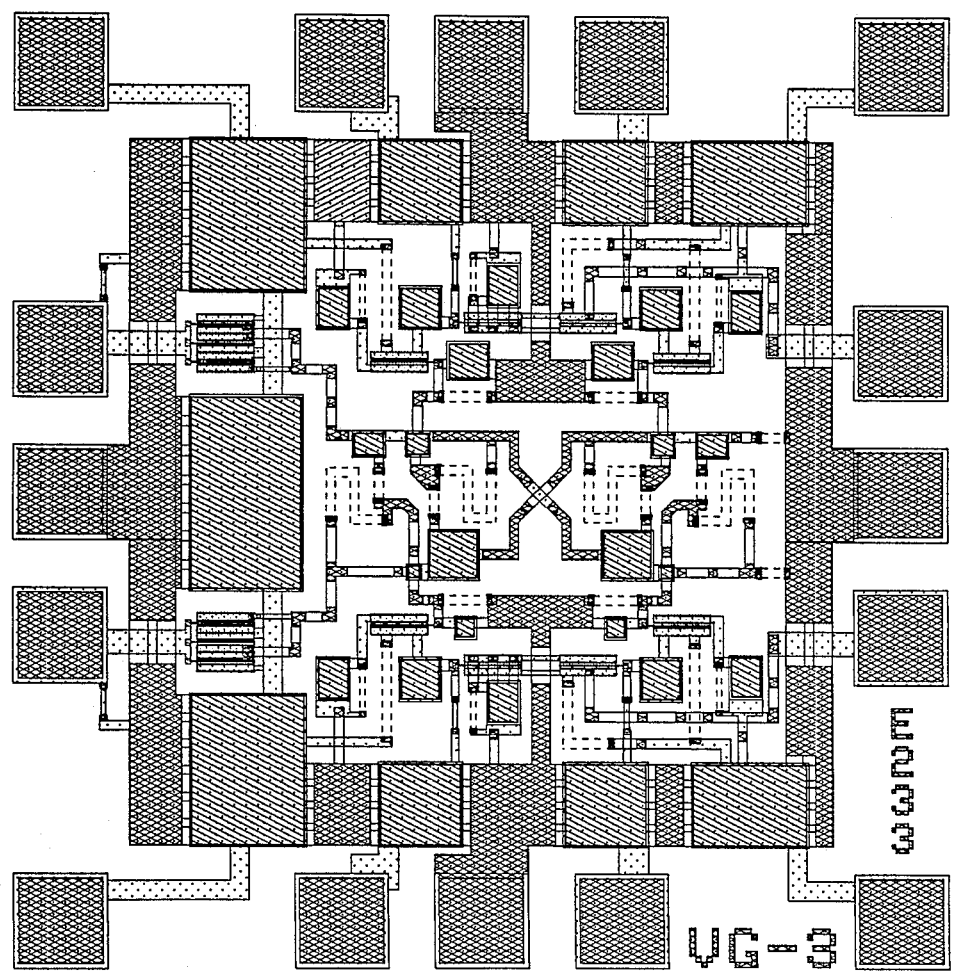
FIG. 6 is a computer derived printout of the printed circuit of the FIG. 5 embodiment illustrating particularly the location of resistors, capacitors, conductors and transistors on a monolithically integrated circuit.

The layout of the FIG. 5 circuit is illustrated in FIG. 6. The circuit is provided with peripheral pads for external circuit connection. The scattered rectangular members showing diagonal markings are capacitors. The short linear figures of narrower cross-section are conductive paths, and the linear figures whose sides are shown in a dotted outline are resistances. The layout retains much of the symmetry of the FIG. 5 electrical circuit configuration with the large input transistors being shown to the left and the output transistors being shown centrally disposed along the bottom and along the top of the layout.

Figure 7:
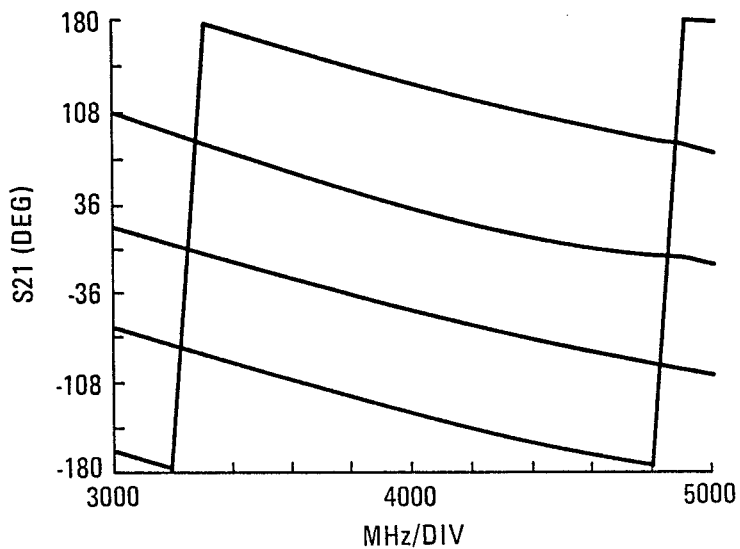
FIG. 7 is an illustration of the phase performance of the embodiment illustrated in FIGS. 5 and 6 over a frequency range of from three to five thousand megahertz.

The phase performance of the FIG. 2 embodiment at each of the four outputs in the 3 to 5 gigahertz range is illustrated in FIG. 7. The drawing illustrates some curvature in each of the four outputs. The phase to phase differences between ports are most accurately described in the mathematical discussions which have preceded. The figure is primarily intended to show that the variation in output phase with frequency, has some nonlinearity through the range of measurement. In many applications of the present phase shift network, variations of the phase relationship between the several ports, is of primary concern, while drift in the reference phase is not. In the event that the drift in the reference phase is of concern, compensation may be introduced before the initial phase splitting.

The all pass networks, which form the phase shifting networks of the present invention, have a unique advantage when applied to monolithic circuits. The tracking errors in all the values of the resistors and capacitors have only a minor effect on the performance of the networks. In a circuit produced monolithically most variations in processing parameters affects all capacitors and all resistors proportionally. The ratios between the values of resistors and those of capacitors are determined by the geometrical characteristics of the mask lay-out, while the absolute values are the result of doping levels or deposition rates. The effect of such a tracking variation in either the capacitance or the resistance values is to change the position of the frequency response of the network. If the network is designed with a band width which exceeds the requirements, the excess can be used to absorb tracking tolerances in both the capacitances and the resistances. The center of the frequency response of the network is inversely proportional to the RC product of the elements.

The term "all pass" in relation to a circuit has been intended to mean an ideal network having an amplitude transfer function which is constant as the frequency goes from zero to infinity. In a vectorial description of such an ideal network, the output may be characterized as a vector defined between a point and a circle in a complex plane, the point being set at the center of the circle. When an AC signal is applied to such a network, the response, as frequency changes, is to cause the vector representing the output to rotate about the center of the circle. Such rotation produces no change in output amplitude, but a continuous change in phase.

"All pass" networks are to be distinguished from "low pass" networks that have an amplitude transfer function which passes signals below and attenuates signals at frequencies above a cross-over frequency, and high pass networks, which have the converse property. "All pass" networks are also to be distinguished from band pass networks that pass signals at a center frequency and attenuate signals at frequencies above and below the center frequency. Using the vectorial description applied to the all pass networks, the output vector of a band pass filter is now defined between a point and a circle in the complex plane, the point being set on the perimeter of the circle. When an AC signal is applied to such a network, the amplitude response, as frequency changes, is to cause the vector representing the output to approach a maximum equal to the diameter of the circle at a center frequency, and to fall off at either side of center to a minimum of zero.

The ideal filter terminology, when applied to real filters, implies that the indicated filter elements approximate the performance predicted for an ideal filter of that type.

The networks of all figures herein disclosed, which may be made up or derived from low pass, high pass, and band pass filter configurations, in the complete configuration, form "all pass" networks.

One may, for instance, in characterizing the "low/high" and "high/low" configurations of FIGS. 3 and 4, describe the eventual all pass filter as being derived from a band pass configuration with a series RC combination and a shunt RC configuration. That configuration is then mathematically transformed to a high pass RC combination serially connected with a low pass RC combination to form a band pass configuration. When a shunt RC combination load is applied to shift the center of the output vector from the circumference to the center of the output circle, the network is transformed from a band pass to an all pass configuration. When the latter network is mathematically transformed, one obtains the two final configurations illustrated in FIGS. 3 and 4.

The unexpected result of the final configurations of FIG. 3 and FIG. 4 are the 7 db reduction in attenuation without a loss in the flatness of the amplitude response or a reduction in the accuracy of the phase differences between output ports.

What is claimed is:

1. A phase shifting circuit with multiple outputs between which a constant phase difference is maintained over a large frequency range, said circuit comprising:
   A. input means including
      (1) a first input port for application of an input signal at reference phase,
      (2) a second input port for application of said input signal at 180° from reference phase;
   B. output means including
      (1) a first output port for derivation of a first output signal at a predetermined phase,
      (2) a second output port for derivation of a second output signal having a constant phase difference from said first output signal;
   C. a four branch all pass network in which
      (1) said first branch comprises a first resistor of value R1 and a first capacitor of value C1 joined and serially connected in the order recited between said first and second input ports, (2) said second branch comprises a second capacitor of value C2 and a second resistor of value R2 joined and serially connected in the order recited between said first and said second input port, the joint thereof being connected to said first output port, (3) said third branch comprises a third capacitor of value C2 and a third resistor of value R2 joined and serially connected in the order recited between said second first input port and said first input port, (4) said fourth branch comprises a fourth resistor of value R1 and a fourth capacitor of value C1 joined and serially connected in the order recited between said second and said first input ports; the joint thereof being connected to said second output port, and said first and fourth branches providing inverted like networks of elements to effect a phase difference of 180° at the joints of said first and fourth branches, and said second and said third branches providing inverted like networks of elements to effect a phase difference of 180° at the joints of said second and third branches, the element values of said first and second branches providing a phase difference of 90° at the joints of first and second branches, whereby outputs at said first and second output ports are provided at 0° and 90° in relation to said predetermined phase.

2. The phase shifting circuit set forth in claim 1 wherein said output means (B) further comprises (3) a third output port for derivation of a third output signal having a constant phase difference from said first and second output signals, said third output port being connected to the joint between said first resistor and said first capacitor in said first branch, and (4) a fourth output port for derivation of a fourth output signal having a constant phase difference from said first, second and third output signals, said fourth output port being connected to the joint between said third resistor and said third capacitor in said third branch whereby output signals are provided at 0°, 90°, 180°, and 270° at said output ports in relation to said predetermined phase.

3. The phase shifting circuit as set forth in claim 2 wherein

D. (1) first switching means are provided coupled to said first and fourth output ports for deriving a signal at said predetermined phase or at a twice 90° phase difference from said predetermined phase to a first output node, and D. (2) second switching means are provided coupled to said second and third output ports for deriving a signal at 90° or at a three times 90° phase difference from said predetermined phase to a second output node, whereby output signals at said output nodes are available at 90° differences only, corresponding respectively to 0° and 90°, 90° and 180°, 180° and 270°, and 270° and 0°, with 0° being at said predetermined phase.

4. A phase shifting circuit with multiple outputs between which a constant phase difference is maintained over a large frequency range, said circuit comprising:

A. input means including (1) a first input port for application of an input signal at reference phase and amplitude, (2) a second input port for application of said input signal at 180° from reference phase and of reference amplitude so as to balance the two inputs in relation to ground;

B. output means including (1) a first output port for derivation of a first output signal at a predetermined phase, (2) a second output port for derivation of a second output signal having a constant phase difference from said first output signal;

c. a four branch all pass network, each branch being a three terminal all pass network of which the amplitude response is constant with frequency and the phase response changes as a function of frequency, connected between said first and second input port and having an output terminal for connection to an output port, and each branch consisting of a first resistor-capacitor combination comprising a first resistor of value RI and a first capacitor of value C1 joined and serially connected in the order recited between said first and second input ports, a second resistor-capacitor combination comprising a second capacitor of value C2 and a second resistor of value R2 joined and serially connected in the order recited between the first resistor-capacitor joint and said second input port, and a third resistor-capacitor combination comprising a third capacitor of value C3 and a third resistor of value R3 joined and serially connected in the order recited between said first resistor-capacitor joint and the second resistor-capacitor joint, the third resistorcapacitor joint being connected to ground, and the second resistor-capacitor joint providing said output terminal, the first and fourth branches of said all pass network forming two mutually inverted configurations of like valued elements to effect 180° phase differences at said first and fourth output terminals, and the second and third branches of said all pass network forming two mutually inverted like configurations of like valued elements to effect 180° differences at said second and third output terminals and to equalize the amplitude and phase response relationships between all terminals as a function of frequency over said frequency range, the element values of said first and second branches providing a phase difference of 90° at said first and second output terminals, whereby outputs are available at 0°, 90°, 180° and 270° in relation to said predetermined phase.

5. A phase shifting circuit as set forth in claim 4 wherein the ratios of the RC time constants of the first RC combinations; and of the second RC combinations, and the third RC combinations of the unlike branches are equal to a constant k equal to $\omega_2\omega/_1$ where $\omega_1$ is the center radial frequency of the first branch $\omega_2$ is the center radial frequency of the second branch, the ratio of radial frequencies and the circuit Q being selected for optimum response.

6. A phase shifting circuit with multiple outputs between which a constant phase difference is maintained over a large frequency range, said circuit comprising:

A. input means including
   (1) a first input port for application of an input signal at reference phase and amplitude,
   (2) a second input port for application of said input signal at 180° from reference phase and of reference amplitude so as to balance the two inputs in relation to ground;
B. output means including
   (1) a first output port for derivation of a first output signal at a predetermined phase,
   (2) a second output port for derivation of a second output signal having a constant phase difference from said first output signal;
C. a four branch all pass network, each branch being a three terminal all pass network of which the amplitude response is constant with frequency and the phase response changes as a function of frequency, connected between said first and second input port and having an output terminal for connection to an output port, and
   each branch consisting of a first resistor-capacitor combination comprising a first capacitor of value C1 and a first resistor of value R1 joined and serially connected in the order recited between said first and second input ports,
   a second resistor-capacitor combination comprising a second resistor of value R2 and a second capacitor of value C2 joined and serially connected in the order recited between the first resistor-capacitor joint and said second input port,
   a third resistor-capacitor combination comprising a third resistor of value R3 and a third capacitor of value C3 joined and serially connected in the order recited between said first resistor-capacitor joint and the second resistor-capacitor joint, the third resistor-capacitor joint being connected to ground, and
   the second resistor-capacitor joint providing said output terminal,
   the first and fourth branches of said all pass network forming two mutually inverted configurations of like valued elements to effect 180° phase differences at said first and fourth output terminals, and the second and third branches of said all pass network forming two mutually inverted like configurations of like valued elements to effect 180° differences at said second and third output terminals and to equalize the amplitude and phase response relationships between all terminals as a function of frequency over said frequency range,
   the element values of said first and second branches providing a phase difference of 90° at said first and second output terminals, whereby outputs are available at 0°, 90°, 180°, and 270° in relation to said predetermined phase.

7. A phase shifting circuit as set forth in claim 6 wherein
   the ratios of the RC time constants of the first RC combinations; and of the second RC combinations, and the third RC combinations of the unlike branches are equal to a constant k equal to $\omega_2/\omega_1$ where $\omega_1$ is the center radial frequency of the first branch
   $\omega_2$ center radial frequency of the second branch, the ratio of radial frequencies and the circuit Q being selected for optimum response.

8. A phase shifting circuit with multiple outputs between which a constant phase difference is maintained over a large frequency range, said circuit comprising:
A. input means including
   (1) a first transistor providing a first input port having a control electrode to which an input signal at reference phase and reference amplitude is applied, one principal electrode of said first transistor being coupled to a bias terminal and the other principal electrode of said first transistor being coupled via a first load resistance to signal ground
   (2) a second transistor providing a second input port having a control electrode to which an input signal at 180° from reference phase and reference amplitude is applied so as to balance the two inputs in relation to ground, one principal electrode of said second transistor being coupled to as bias terminal and the other principal electrode of said second transistor being coupled via a second load resistance to signal ground,
B. output means including
   (1) a first output port for derivation of a first output signal at a predetermined phase,
   (2) a second output port for derivation of a second output signal having a constant phase difference from said first output signal;
c. a four branch all pass network connected between said other principal electrodes of said first and second transistors,
   each branch being a three terminal all pass network of which the amplitude response is constant with frequency and the phase response changes as a function of frequency, connected between said first and second input port and having an output terminal, and
   (1) the first and fourth branches of said all pass network forming two mutually inverted configurations of like valued elements to effect 180° phase differences at said first and fourth output terminals, and the second and third branches of said all pass network forming two mutually inverted like configurations of like valued elements to effect 180° differences at said second and third output terminals and to equalize the amplitude and phase response relationships between all terminals as a function of frequency over said frequency range,
   the element values of said first and second branches providing a phase difference of 90° at said first and second output terminals, whereby outputs are available at 0°, 90°, 180° and 270° in relation to said predetermined phase.

9. The phase shifting circuit set forth in claim 8 wherein
   said first and second transistors are field effect transistors connected in a source follower configuration to provide low impedance drives for said four branch all pass network.

10. The phase shifting circuit as set forth in claim 9 wherein said output means (B) comprises
   (1) a third transistor connected in a source follower configuration to provide a high impedance output for said first branch,
   (2) a fourth transistor connected in a source follower configuration to provide a high impedance output for said second branch, (3) a fifth transistor connected in a source follower configuration to provide a high impedance output for said third branch, (4) a sixth transistor connected in a source follower configuration to provide a high impedance output for said fourth branch.

11. The phase shifting circuit as set forth in claim 9 having in addition thereto
   (3) a third output port for derivation of a third output signal having a constant phase difference from said first and second output signals, and
   (4) a fourth output port for derivation of a third output signal having a constant phase difference from said first, second and third outputs.

12. A phase shifting circuit with multiple outputs between which a constant phase difference is maintained over a large frequency range, said circuit comprising:
   A. input means including
      (1) a first input port for application of an input signal at reference phase and amplitude,
      (2) a second input port for application of said input signal at 180° from reference phase and of reference amplitude so as to balance the two inputs in relation to ground;
   B. a four branch all pass network, each branch being a three terminal all pass network of which the amplitude response is constant with frequency and the phase response changes as a function of frequency, connected between said first and second input port and having an output terminal,
      the first and fourth branches of said all pass network forming two mutually inverted configurations of like valued elements to effect 180° phase differences at said first and fourth output terminals, and
      the second and third branches of said all pass network forming two mutually inverted like configurations of like valued elements to effect 180° differences at said second and third output terminals and to equalize the amplitude and phase response relationships between all terminals as a function of frequency over said frequency range,
      the element values of said first and second branches providing a phase difference of 90° at said first and second output terminals to provide outputs at 0°, 90°, 180°, and 270° in relation to said predetermined phase, and
   c. output switching means comprising
      (1) a first pair of transistor switches individually coupled to the output terminals of said second and fourth branches respectively for selectively coupling a signal at said predetermined phase or at a twice 90° phase difference from said predetermined phase to a first output, and
      (2) a second pair of transistor switches individually coupled to the output terminals of said first and third branches respectively for selectively coupling a signal at 90° or at a three times 90° phase difference from said predetermined phase to a second output, whereby
      output signals at said respective outputs are available at 90° differences, corresponding to 0°, and 270°, 0° and 90°, 180° and 270°, and 180° and 90°, with 0° corresponding to said predetermined phase.

13. The phase shifting circuit as set forth in claim 12, wherein
   said input means (A), output means (B), and said four branch all pass networks are assembled on a monolithic substrate having semiconducting regions suitable for formation of said transistors and insulating regions suitable for formation of said resistors and capacitors.

14. The phase shifting network set forth in claim 13, wherein said substrate material is gallium arsenide.

* * * * *